United States Patent
Kawamura et al.

(10) Patent No.: US 8,756,775 B2
(45) Date of Patent: *Jun. 24, 2014

(54) METHOD FOR SMOOTHING A SURFACE OF AN ELECTRODE

(75) Inventors: Akiyoshi Kawamura, Nagaokakyo (JP); Takako Sato, Moriyama (JP); Osamu Chikagawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1337 days.

This patent is subject to a terminal disclaimer.

(21) Appl. No.: 12/547,616

(22) Filed: Aug. 26, 2009

(65) Prior Publication Data
US 2009/0301764 A1 Dec. 10, 2009

Related U.S. Application Data

(63) Continuation of application No. PCT/JP2009/053161, filed on Feb. 23, 2009.

(30) Foreign Application Priority Data

Mar. 14, 2008 (JP) ................................. 2008-065343

(51) Int. Cl.
*B23P 13/00* (2006.01)
(52) U.S. Cl.
USPC ............. 29/2; 29/25.03; 29/592.1; 29/623.1; 361/502
(58) Field of Classification Search
USPC .................. 29/2, 25.03, 592.1, 628.1, 623.1; 361/502
See application file for complete search history.

(56) References Cited

U.S. PATENT DOCUMENTS

| | | | | |
|---|---|---|---|---|
| 7,567,429 B2* | 7/2009 | Mori et al. | | 361/502 |
| 7,569,493 B2* | 8/2009 | Hachigo et al. | | 438/759 |
| 2003/0140490 A1* | 7/2003 | Olson et al. | | 29/846 |
| 2006/0264011 A1* | 11/2006 | Hachigo et al. | | 438/483 |
| 2007/0252249 A1 | 11/2007 | Murai et al. | | |
| 2008/0030924 A1* | 2/2008 | Mori et al. | | 361/502 |
| 2008/0272088 A1 | 11/2008 | Kamiya et al. | | |
| 2009/0301764 A1* | 12/2009 | Kawamura et al. | | 174/250 |
| 2010/0271748 A1* | 10/2010 | Yoon et al. | | 361/301.3 |

FOREIGN PATENT DOCUMENTS

| | | |
|---|---|---|
| JP | 4-111769 A | 4/1992 |
| JP | 9-109004 A | 4/1997 |
| JP | 2000-315667 A | 11/2000 |

(Continued)

OTHER PUBLICATIONS

Official Communication issued in International Patent Application No. PCT/JP2009/053161, mailed on Mar. 24, 2009.

(Continued)

*Primary Examiner* — Carl Arbes
(74) *Attorney, Agent, or Firm* — Keating & Bennett, LLP

(57) ABSTRACT

A method is provided for efficiently and securely smoothing a surface of an electrode disposed on a base, such as a ceramic substrate, without damaging the electrode or the base. The electrode is fired by a non-shrinkage process using a constraining layer and is separated from the constraining layer. The base including the electrode disposed thereon is prepared and a surface of the electrode is smoothed by vibrating media such that the media are arranged to be in contact with the electrode.

13 Claims, 5 Drawing Sheets

(56) References Cited

FOREIGN PATENT DOCUMENTS

| | | | |
|---|---|---|---|
| JP | 2006-2615 A | | 1/2006 |
| JP | 2007-318098 A | | 12/2007 |
| JP | 2007-318173 A | | 12/2007 |
| WO | 2005-124801 A1 | * | 12/2005 |
| WO | 2007/015551 A1 | | 2/2007 |

OTHER PUBLICATIONS

Kawamura et al. "Method for Manufacturing Ceramic Substrate and Ceramic Substrate"; U.S. Appl. No. 12/547,621, filed Aug. 26, 2009.

Official Communication issued in corresponding German Patent Application No. 11 2009 000 008.8, mailed on Sep. 13, 2013.

* cited by examiner

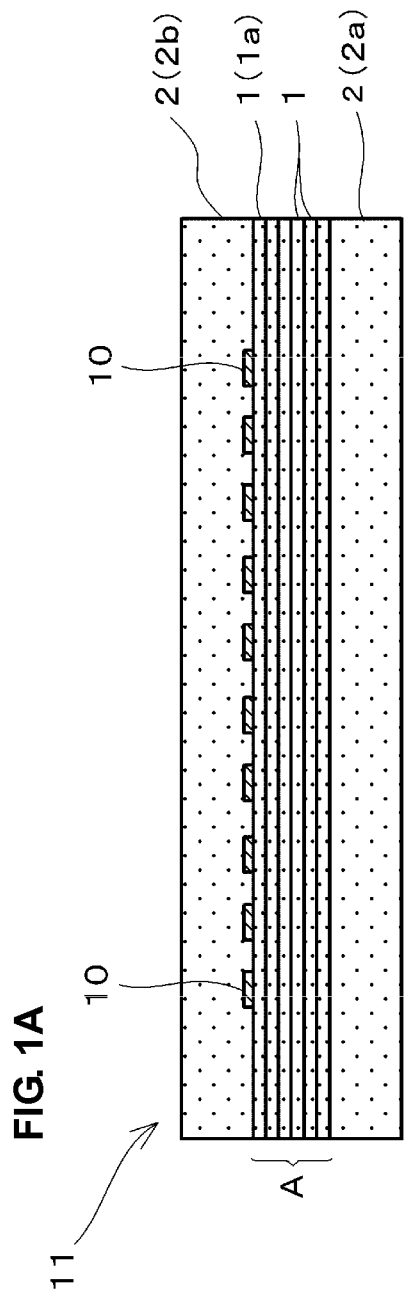
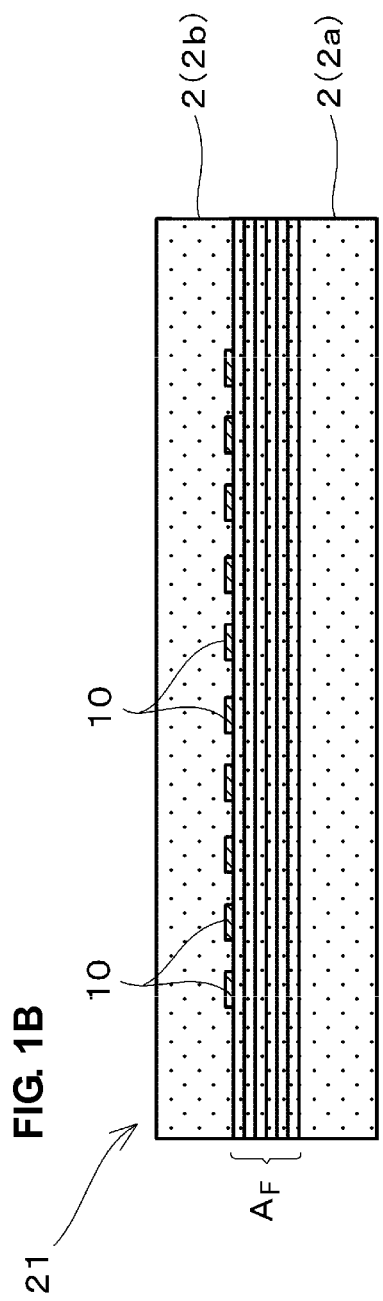

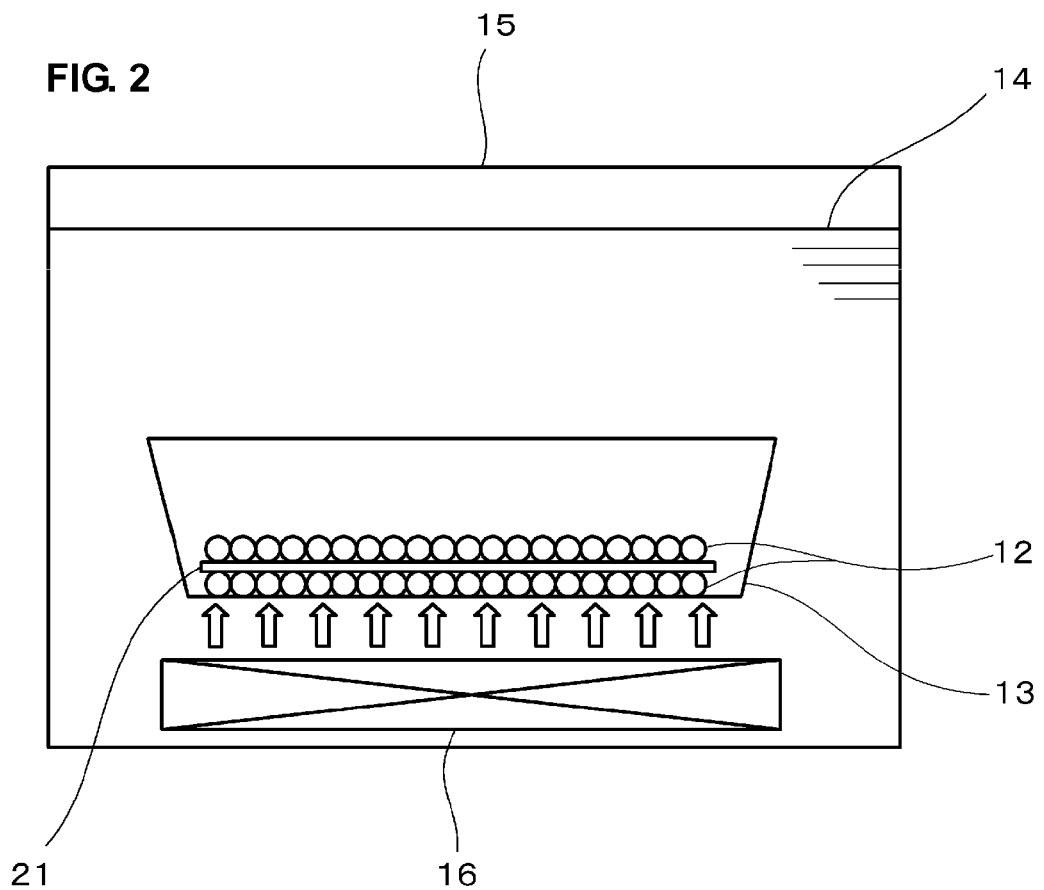

METHOD FOR SMOOTHING A SURFACE OF AN ELECTRODE

BACKGROUND OF THE INVENTION

1. Field of the Invention

The present invention relates to a method for smoothing an electrode disposed on a base, such as a substrate, a method for manufacturing a ceramic substrate using the smoothing method, and a ceramic substrate manufactured by the manufacturing method.

2. Description of the Related Art

In general, sintered metal electrodes disposed on ceramic substrates have high surface roughness and therefore do not necessarily have sufficient smoothness. In particular, electrodes that are formed on a ceramic substrate manufactured by the following process are likely to have insufficient smoothness: a non-shrinkage process in which the ceramic substrate is fired in a firing step so as not to transversely shrink such that constraining layers made of a sintering-resistant material that is not substantially sintered at the firing temperature of the ceramic substrate are provided on principal surfaces of the unfired ceramic substrate. This is because the electrodes have surface irregularities formed when removing the constraining layers.

Furthermore, electrodes formed by a screen-printing process or other processes are likely to have high surface roughness due to mesh traces.

Electrodes arranged on ceramic substrates are used as junctions for, for example, other substrates or mounting lands of circuit components. However, there is a problem in that the electrodes are likely to have insufficient properties, such as platability and wettability, when the electrodes have high surface roughness.

In a case in which, for example, electrodes formed on ceramic substrates are subjected to Ni plating, Ni particles grow isotropically. When these electrodes, which are bases, have irregularities, secondary particles of the Ni particles continue to grow so as to gradually cover the Ni particles deposited in recessed portions, and therefore, the irregularities are smoothed to some extent. Since the time required for the secondary particles to reach a certain height varies depending on the locations thereof, boundaries of the secondary particles grow with the growth of secondary particles. As a result, macroscopic networks of impurities are formed at the secondary particle boundaries. The impurities are melted during displacement plating to cause significant local corrosion. This causes blackening of the electrodes which causes problems, such as, a reduction in the soldering contact area and solder popping caused by water that is trapped in corroded portions.

Where electrodes that are subjected to wire bonding have surface irregularities, the wire pull strength thereof is relatively low. When such an electrode is subjected to Ni or Au plating, a Ni or Au plating layer growing thereon follows irregularities of the electrode and grain boundaries and therefore has surface irregularities.

Where surface irregularities of an electrode is smoothed by forming a thick plating layer thereon, there is a problem in that a substrate having the electrode disposed thereon is damaged and has a reduced strength because the immersion time of the substrate in a plating bath is relatively long and a portion of the substrate is dissolved.

In view of the problems described above, the following method has been proposed: a method in which the surface roughness of an external electrode removed from a constraining layer is adjusted to a range of about 0.1 µm to about 6 µm such that the platability and/or wettability thereof can be secured (see Japanese Unexamined Patent Application Publication No. 2007-318173).

Japanese Unexamined Patent Application Publication No. 2007-318173 describes that the platability and/or wettability of the external electrode can be ensured such that the surface roughness of the external electrode removed from the constraining layer is adjusted to about 0.1 µm to about 6 µm.

However, Japanese Unexamined Patent Application Publication No. 2007-318173 discloses no technique to accurately adjust or control the surface roughness of the external electrode removed from the constraining layer.

SUMMARY OF THE INVENTION

To overcome the problems described above, preferred embodiments of the present invention provide a method for efficiently and securely smoothing a surface of an electrode disposed on a base, such as a substrate, without damaging the base or the electrode, particularly an electrode which is fired by a non-shrinkage process using a constraining layer and which is separated from the constraining layer, a method for manufacturing a ceramic substrate including an electrode with a surface smoothed by the method, and a substrate that can be manufactured by the manufacturing method, including an electrode with a smooth surface.

A method for smoothing a surface of an electrode according to a preferred embodiment of the present invention includes the steps of preparing a base having the electrode disposed thereon and smoothing the electrode surface by vibrating media such that the media are arranged to be in contact with the electrode.

The media are preferably vibrated such that the base is immersed in a treatment liquid and an ultrasonic wave is applied to the treatment liquid, for example.

The ultrasonic wave is preferably applied to the treatment liquid such that the base is arranged above a tray with the media disposed thereon such that the electrode is in contact with the media.

The ultrasonic wave may preferably be applied to the treatment liquid such that the base is disposed on or above a tray such that a surface of the base having the electrode disposed thereon faces upward and such that the media are arranged over the base such that the electrode is in contact with the media.

The treatment liquid is preferably deaerated water, for example. The media preferably have a density greater than that of the treatment liquid.

The media preferably have a hardness greater than that of the electrode, which is disposed on the base. The media preferably have a spherical shape, for example.

The media are preferably made of zirconia, for example.

The electrode preferably includes an end portion and a central portion having a surface roughness different from that of the end portion.

Examples of a technique for causing the surface roughness of the end portion of the electrode to be different from that of the central portion include masking a region to be surface-roughened such that the region is prevented from being smoothed by the bombardment of the media, roughening a desired region of the smoothed electrode surface by a wet blasting process or other suitable process, adjusting the relationship between the size of the medium and the thickness of the electrode, such that the end portion of the electrode is less likely to be bombarded with the media, and adjusting the direction of the media applied to the electrode.

A method for manufacturing a ceramic substrate according to a preferred embodiment of the present invention includes a step of smoothing a surface of an electrode made of a sintered metal by the electrode-smoothing method.

The ceramic substrate-manufacturing method preferably further includes a step of forming a plating layer on the smoothed electrode.

A ceramic substrate according to a preferred embodiment of the present invention is manufactured by the ceramic substrate-manufacturing method described above and includes an electrode with a smoothed surface.

A method for smoothing an electrode according to a preferred embodiment of the present invention is capable of efficiently smoothing a surface of the electrode with vibrating media because the electrode surface is smoothed by vibrating the media such that the media are arranged to be in contact with the electrode.

According to preferred embodiments of the present invention, portions of the electrode that are bombarded with the media by vibration are smoothed. The moving speed of the media is relatively low and the energy generated by the vibration of the media is not as high as the energy that is generated by, for example, a sandblasting process, sufficient to ground the electrode. Therefore, only protruding portions of the electrode that are in point contact with the media are smoothed. As a result, the electrode surface can be smoothed to such an extent that the electrode surface is mirror-polished without damaging the electrode or a base having the electrode disposed thereon.

The smoothing of the electrode allows the size of secondary particles to remain relatively small when a Ni plating layer is formed on the electrode. Thus, macroscopic networks of impurities can be prevented from being formed at boundaries between the secondary particles. Therefore, problems, such as solder popping and reduced bonding strength during wire bonding, that occur in conventional techniques can be reduced or prevented.

In preferred embodiments of the present invention, the material and the shape of the base is not particularly limited. The base may preferably be a tabular member or a rectangular parallelepiped structure, such as a chip electronic component, for example. Preferred embodiments of the present invention are widely applicable to the smoothing of surfaces of electrodes disposed on various bases.

According to the electrode-smoothing method, a surface of the base can also be smoothed in some cases depending on the material and/or properties of the base.

The term "a state in which the media are arranged to be in contact with the electrode" as used herein is a broad concept that covers, for example, a state in which the media disposed on the electrode are temporarily lifted from the electrode by vibration and then deposited on the electrode, a state in which the electrode and the media are temporarily separated from each other because of the vibration of the media and then brought into contact with each other when the base is disposed on the media such that a surface of the base that having the electrode disposed thereon faces downward, and another state.

Where the media are vibrated such that the base is immersed in a treatment liquid and an ultrasonic wave is applied to the treatment liquid, the media can be efficiently vibrated with the ultrasonic wave and the vibration of the media can be precisely controlled. Thus, the electrode can be more efficiently smoothed. This improves the effectiveness of preferred embodiments of the present invention.

Where the ultrasonic wave is applied to the treatment liquid such that the base is disposed above a tray including the media such that the electrode is in contact with the media, the electrode surface can be more efficiently smoothed by vibrating the media with the electrode and the media held in contact with each other.

On a microscopic level, the electrode and the media are temporarily separated from each other because the media are vibrated. However, the electrode and the media can be maintained substantially in continuous contact with each other. Thus, the electrode surface can be efficiently smoothed.

Where the ultrasonic wave is applied to the treatment liquid such that the base is disposed on or above a tray such that a surface of the base having the electrode disposed thereon faces upward and such that the media are arranged over the base such that the electrode is in contact with the media, substantially the same advantages as those described above can be achieved.

When the treatment liquid used is deaerated water, the sound pressure of the ultrasonic wave is relatively high, and therefore, the media can be strongly vibrated. Thus, the electrode surface can be efficiently smoothed.

When the media have a density greater than that of the treatment liquid, the media are not suspended in the treatment liquid, and therefore, can be securely maintained on the electrode. Thus, the electrode surface can be efficiently smoothed.

When the media have a hardness greater than that of the electrode, the electrode surface can be efficiently smoothed.

When the media have a spherical shape, the media are readily rotated or moved on the electrode, and therefore, the electrode surface can be efficiently smoothed without damaging the electrode or the base.

When the media are made of zirconia, the electrode surface can be efficiently smoothed because zirconia has a high Mohs hardness of about 8.5 and a density of about 5.8, that is, zirconia has a higher density than a liquid component included in a common treatment liquid.

A surface of the base can be smoothed in some cases depending on the hardness of the base.

A method for manufacturing a ceramic substrate according to a preferred embodiment of the present invention includes a step of smoothing a surface of an electrode by the electrode-smoothing method, the electrode preferably being made of a sintered metal and being formed together with the ceramic substrate by co-firing. Therefore, the ceramic substrate can be efficiently manufactured so as to include the electrode with excellent surface smoothness.

In the ceramic substrate manufactured by the method described above, the surface smoothness of the electrode is excellent, and therefore, a dense plating layer can be formed on the electrode. Thus, the plating layer has no significant irregularities, secondary particles do not have large boundaries, and networks of impurities are prevented from being formed at boundaries between the secondary particles, whereby problems, such as solder popping and reduced bonding strength, during wire bonding can be reduced or prevented.

Where a Ni plating layer is formed on the electrode, the thickness of the Ni plating layer may be less than conventional plating layers because the electrode surface is smooth.

Although macroscopic networks of impurities are formed at boundaries between secondary particles in Ni plating layers formed on conventional electrodes with smooth surfaces, such macroscopic networks are prevented from being formed in the Ni plating layer. Therefore, problems, such as solder popping and reduced bonding strength during the wire bonding of electrodes, as compared to conventional techniques can be reduced or prevented.

A ceramic substrate according to a preferred embodiment of the present invention is manufactured by the ceramic substrate-manufacturing method described and includes an electrode with a smoothed surface. The ceramic substrate does not experience problems, such as solder popping and reduced bonding strength during the wire bonding of electrodes, but has high reliability.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1A is an illustration of an unfired laminate, prepared in accordance with a preferred embodiment of the present invention, having a structure in which constraining layers are disposed on the upper and lower sides of a base layer (unfired ceramic substrate) and FIG. 1B is an illustration of a fired laminate obtained by firing the unfired laminate.

FIG. 2 is an illustration of a technique for removing the constraining layers from the fired laminate obtained by firing the unfired laminate shown in FIG. 1.

DETAILED DESCRIPTION OF PREFERRED EMBODIMENTS

Figure 3:
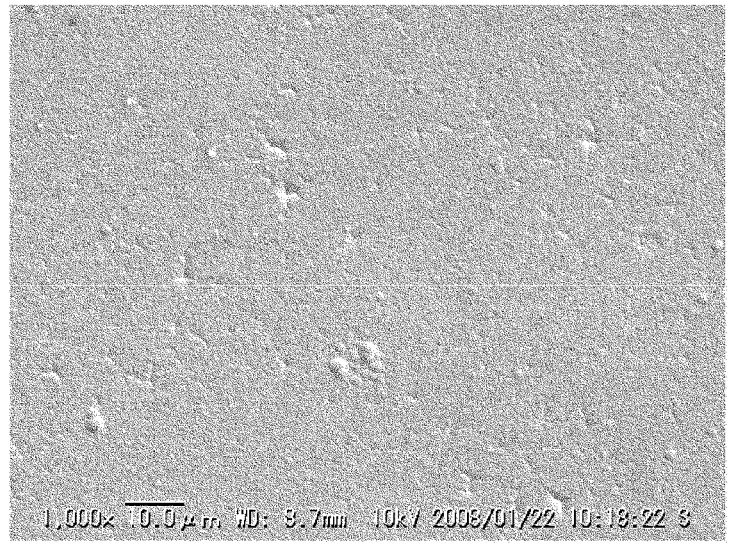
FIG. 3 is an image of an electrode taken with a SEM (scanning electron microscope), the electrode being smoothed by a method according to a preferred embodiment of the present invention and then plated.

Examples of preferred embodiments of the present invention will now be described in detail with reference to the drawings.

Example 1

In Example 1, a base is defined by a ceramic substrate and an electrode is made of a sintered metal that is formed on the ceramic substrate by co-firing. A method for manufacturing the ceramic substrate is described below. The method includes a step of smoothing the electrode by a method according to a preferred embodiment of the present invention.

A base layer for forming a principal portion of the ceramic substrate by firing was prepared by a procedure below.

A ceramic powder, and preferably an alumina powder, for example, was prepared. A glass powder, and preferably a borosilicate glass powder including the following compounds was prepared: about 59 weight percent $SiO_2$, about ten weight percent $B_2O_3$, about 25 weight percent $CaO$, and about six weight percent $Al_2O_3$, for example.

The aluminum powder and the glass powder were preferably mixed together at a weight ratio of about 40:60, for example. The powder mixture was preferably mixed with an adequate amount of a binder, a dispersant, a plasticizer, and an organic solvent, for example, whereby a ceramic slurry was prepared.

The ceramic slurry was formed into base layer green sheets preferably by a doctor blade process, for example.

In order to evaluate properties, a ceramic green sheet including about 0.4-mm square pad electrodes 10 (FIGS. 1A and 1B) was prepared for a base layer green sheet to form the upper surface of the base layer A formed by stacking the base layer green sheets. The pad electrodes 10 were preferably formed by screen printing using Ag electrode paste, for example.

Ceramic green sheets which define constraining layer ceramic green sheets for forming constraining layers were prepared by a procedure below.

In Example 1, a ceramic powder that was not substantially sintered at the firing temperature of the base layer ceramic green sheets, preferably an $Al_2O_3$ powder with an average particle size of about 1.0 μm, for example, was dispersed in an organic vehicle including an organic binder, an organic solvent, and a plasticizer, whereby slurry was prepared.

The obtained slurry was preferably formed into constraining layer ceramic green sheets with a thickness of about 300 μm, for example.

The constraining layer ceramic green sheets preferably have a sintering temperature of about 1400° C. to about 1600° C., for example, and therefore, are not substantially sintered at the sintering temperature of the base layer ceramic green sheets.

As shown in FIG. 1A, one of the constraining layer ceramic green sheets 2 (2a), the base layer ceramic green sheets 1, and another one of the constraining layer ceramic green sheets 2 (2b) were preferably stacked in that order and then pressed with a pressure of about 5 MPa to about 200 MPa, for example, by isostatic pressing or another technique, whereby an unfired laminate 11 including the constraining layers 2 (2a and 2b) that are disposed on the upper and lower sides of the base layer A (unfired ceramic substrate) was prepared (see FIG. 1A).

In Example 1, the base layer ceramic green sheets 1 were preferably stacked such that the base layer A (unfired ceramic substrate) had a thickness of about 300 μm, for example. The base layer ceramic green sheet 1 (1a) including the about 0.4-mm square pad electrodes (Ag electrodes) was preferably used as a base layer green sheet 1 to form the upper surface of the base layer A.

The constraining layer ceramic green sheets preferably having a thickness of about 300 μm, for example, were each deposited on the upper and lower sides of the base layer A (unfired ceramic substrate), whereby the constraining layers 2 (2a and 2b) having a thickness of about 300 μm were formed.

In Example 1, the base layer A was preferably prepared by stacking the base layer ceramic green sheets 1 so as to have a multilayer structure. A single-sheet ceramic substrate can be manufactured such that a base layer with a single-layer structure is prepared using one of the base layer ceramic green sheets 1.

In Example 1, the constraining layers 2 were preferably provided on the upper and lower sides of the base layer A. One of the constraining layers 2 may preferably be provided on a principal surface of the base layer A.

In Example 1, the constraining layers 2 were each formed from a corresponding one of the constraining layer ceramic green sheets. The constraining layers 2 may preferably include some of the constraining layer ceramic green sheets.

The unfired laminate 11 was heat-treated at a low degreasing temperature (preferably a temperature of, for example, about 400° C.) in air, whereby an organic substance such as a binder was removed.

The unfired laminate was fired such that the unfired laminate was preferably heated to about 900° C. under a condition such that the ceramic powder included in the constraining layers was not sintered but the base layer was sintered. This provided a fired laminate 21 including a sintered base layer $A_F$ having principal surfaces overlaid with the unsintered constraining layers 2 (2a and 2b) as shown in FIG. 1B.

The constraining layers 2 (2a and 2b) were removed from the fired laminate 21, which was obtained as described above, and surfaces of the electrodes were smoothed by a method described below.

As shown in FIG. 2, spherical media (hereinafter referred to as zirconia balls) 12, preferably made of zirconia ($ZrO_2$), having a diameter of about 2 mm, for example, were spread over a tray 13 made of stainless steel and the fired laminate 21, which included the sintered base layer $A_F$ having principal surfaces overlaid with the unsintered constraining layers 2 (FIG. 1(b)), was provided on the zirconia balls 12. The media, that is, the zirconia balls 12 were provided on the fired laminate 21 so as to form one or two layers (FIG. 2 shows a layer of the zirconia balls 12). In Example 1, the sintered base layer $A_F$ corresponds to a base according to a preferred embodiment of the present invention.

The zirconia balls 12, the tray 13, and the fired laminate 21 were disposed in an ultrasonic cleaning tank 15 having an output of about 600 W and a frequency of about 40 kHz filled with a treatment liquid 14. The constraining layers were removed and the electrodes were smoothed such that an ultrasonic wave was applied to the tray 13 from an ultrasonic oscillator 16 such that the zirconia balls 12 were vibrated for about 30 minutes.

In order to increase the sound pressure of the ultrasonic wave applied thereto, deaerated water was preferably used as the treatment liquid 14.

For comparison, the following laminate was prepared by the same procedure as that of Example 1: a fired laminate including a sintered base layer and unsintered constraining layers disposed on both principal surfaces thereof. These constraining layers were removed from the fired laminate by a wet blasting process such that the fired laminate was blasted with slurry preferably having a #500 alumina abrasive grain concentration of about 15% with a pressure of about 0.15 MPa, for example, whereby a sintered base layer (ceramic substrate) including electrodes exposed at a surface thereof was obtained.

After the sintered base layer obtained by removing the constraining layers by the method of Example 1 and the sintered base layer obtained by removing the constraining layers by the procedure of the comparative example were cleaned, the pad electrodes (e.g., Ag electrodes), which were disposed on surfaces thereof, were subjected to Ni plating, whereby Ni plating layers with a thickness of about 5 μm, for example, were formed on the pad electrodes.

The Ni plating layers were subjected to Pd plating, whereby Pd plating layers with a thickness of about 0.2 μm, for example, were formed on the Ni plating layers. The Pd plating layers were subjected to Au plating, whereby Au plating layers with a thickness of about 0.1 μm, for example, were formed on the Pd plating layers, whereby electrodes including plating layers with a three-layer structure were formed on the Ag electrodes.

Samples obtained by the procedure of Example 1 and samples obtained by the procedure of the comparative example were evaluated such that pad electrodes were measured for surface roughness Ra and wire pull strength (W/B pull strength) The evaluation results are shown in Table 1.

TABLE 1

|  | Example (N = 10) | Comparative Example (N = 10) |
|---|---|---|
| Surface roughness Ra (μm) | 0.15 | 0.60 |
| Wire pull strength (average) (gf) | 8.05 | 6.45 |

The surface roughness Ra and wire pull strength of each electrode were measured by techniques below.

(1) Surface Roughness Ra

Each pad electrode was measured for line roughness with a laser microscope, whereby the surface roughness Ra thereof was determined.

(2) Wire Pull Strength

An Au wire preferably having a diameter of about 20 μm and a length of 800 μm, for example, was bonded to each pad electrode and then pulled with a wire pull tester. The wire pull strength of the pad electrode was defined as the tensile force applied to the wire when the wire was broken or the junction therebetween or the proximity thereto was broken or stripped off.

As shown in Table 1, the electrodes of the samples of the comparative example have a surface roughness Ra of about 0.60 μm. However, the electrodes of the samples of Example 1 have a surface roughness Ra of about 0.15 μm. This confirms that the electrodes of the samples of Example 1 have excellent smoothness.

The samples of the comparative example have a wire pull strength of about 6.45 gf. However, the samples of Example 1 have a wire pull strength of about 8.05 gf. This confirms that the problem of a reduced bonding strength during wire bonding is prevented.

The above results confirm that electrodes disposed on a sintered base layer (base) can be efficiently smoothed by the following procedure as described in Example 1: after a fired laminate including a sintered base layer and unsintered constraining layers is formed, the constraining layers are removed from the sintered base layer and the electrodes are smoothed such that media are vibrated by the application of an ultrasonic wave such that the media are in contact with the constraining layers. The electrodes have smooth surfaces. Thus, when Ni plating layers are formed on the smooth surfaces thereof, macroscopic networks of impurities are prevented from being formed at boundaries between secondary particles and therefore a problem, such as solder popping.

FIG. 3 is an image of an electrode taken with a SEM (scanning electron microscope), the electrode being smoothed by the method of Example 1 and then subjected to Ni plating, Pd plating, and Au plating in that order, such that a Ni plating layer, a Pd plating layer, and an Au plating layer are formed on the electrode in that order.

Figure 4:
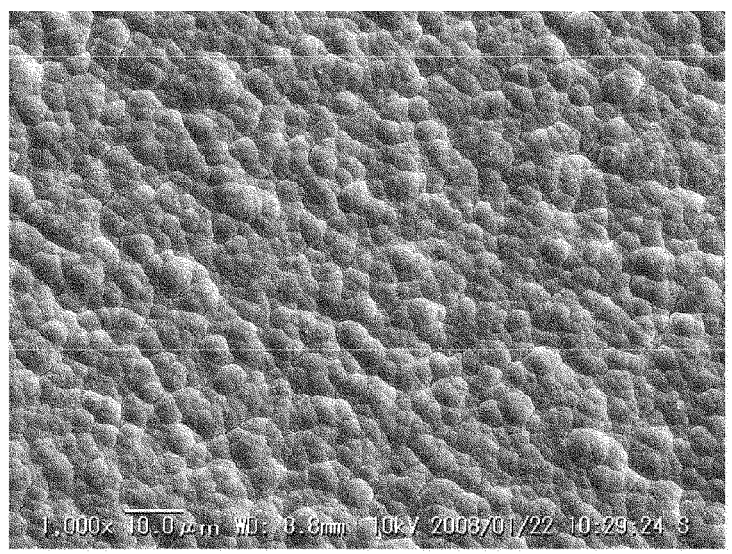
FIG. 4 is an image of an electrode taken with a SEM (scanning electron microscope), the electrode being smoothed by a method used in a comparative example and then plated in substantially the same manner as that described in a preferred embodiment of the present invention.

FIG. 4 is an image of an electrode taken with a SEM (scanning electron microscope), the electrode being prepared by the procedure of the comparative example and then plated in substantially the same manner as that described above such that plating layers are formed thereon.

FIG. 4 shows that the sample of the comparative example has a large number of surface irregularities and macroscopic networks are present at boundaries between secondary particles in the plating layers. On the other hand, FIG. 3 shows that the sample of Example 1 has high smoothness and particle boundaries are not significantly observed.

Comparing Example 1 and the comparative example, the wet blasting process used in the comparative example is a technique for grinding a surface of an electrode with abrasive grains and the method of Example 1 is a technique in which after particles in a constraining layer on an electrode are removed with media, portions of the electrode that are bombarded with the media by vibration are rolled such that a surface thereof is planarized. Therefore, the method of Example 1 is effective to reduce the surface roughness of an electrode. It is widely known that a reduction in electrode surface roughness advantageously leads to an increase in wire pull strength. This advantage is clearly shown by the results of Example 1 as shown in Table 1. Since each electrode has high surface smoothness, the angle between a surface of the electrode and a capillary attached to a wire bonder can preferably be maintained at about 90 degrees, for example. This likely produces to an increase in wire pull strength.

In the method of Example 1, portions of each electrode that are bombarded with the media by vibration are smoothed. The energy applied to the electrode from the media is only sufficient to roll portions protruding from the electrode, and therefore, the electrode is smoothed without being ground. This preferably enables the plated electrode to have a surface roughness (Ra) of about 0.15 μm, for example, that is, substantially the same smoothness as that of a copper foil electrode mounted on a printed circuit board.

Figure 5:
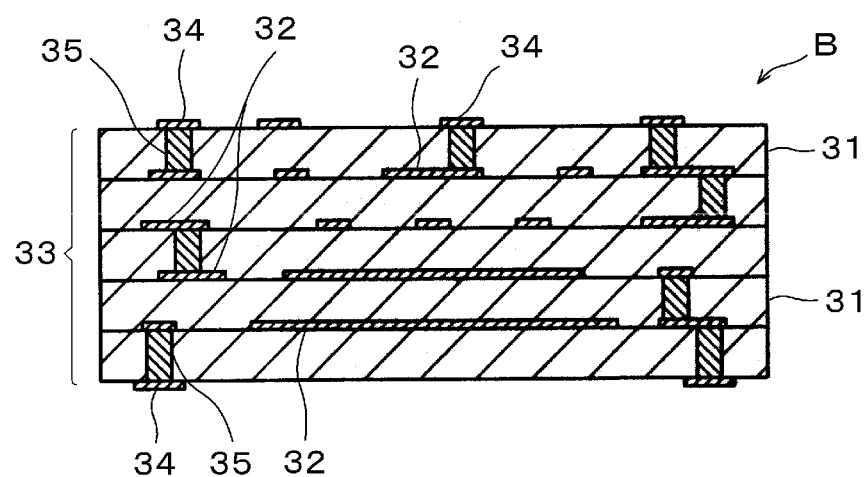
FIG. 5 is an illustration of an example of a ceramic multilayer substrate which can be manufactured in accordance with a preferred embodiment of the present invention and which has a common structure.

In Example 1, the removal of the constraining layers and the smoothing of the electrodes were performed in one step as described above. After the constraining layers are removed, the electrodes may preferably be smoothed in a step independent from the step of removing the constraining layers.

Where the method of Example 1 is used to manufacture a ceramic substrate with a common structure, that is, a ceramic multilayer substrate B which preferably includes, for example, a laminate 33 including a plurality of stacked insulating ceramic layers 31 and internal conductors 32 disposed therebetween and also including surface conductors 34 arranged on the laminate 33 and which is configured such that the internal conductors 32 are connected to each other or the internal conductors 32 are connected to the surface conductors 34 with via-hole conductors 35 as shown in FIG. 5, advantages similar to those of Example 1 are obtained and the ceramic multilayer substrate is obtained such that the surface conductors 34 have excellent smoothness.

In order to investigate the influence of the size of media on the smoothness of electrodes, the following media and balls were used in a step of removing constraining layers from fired laminates and smoothing electrodes in substantially the same manner as that described in Example 1: spherical zirconia balls made of zirconia ($ZrO_2$) and having a diameter of about 1 mm; spherical zirconia balls having a diameter of about 3 mm; and other balls, such as spherical zirconia balls having a diameter of about 2 mm.

As a result, it was confirmed that the use of the about 1-mm diameter zirconia balls was ineffective to sufficiently smooth the electrodes and caused the constraining layers to be insufficiently removed.

This is likely because the about 1-mm diameter zirconia balls have a mass too small to sufficiently remove the constraining layers and to sufficiently smooth the electrodes since the energy generated by vibrating the media by the application of an ultrasonic wave is relatively small.

The reason that the about 1-mm diameter zirconia balls are ineffective to sufficiently smooth the electrodes is likely that the energy generated therefrom is small and therefore the media have a relatively small effect in rolling portions of the electrodes that are bombarded with the media such that surfaces thereof are planarized.

There are some reasons why the use of the about 1-mm diameter zirconia balls insufficiently removes the constraining layers. One of the reasons is likely that energy sufficient to destroy reactive layers formed between the constraining layers and sintered base layers are not generated.

Where the output of ultrasonic waves was increased (that is, the sound pressure thereof was increased) such that high energy was generated, a desired effect was not obtained because the media had an extremely small mass and therefore scattered out of a tray.

It was confirmed that the use of the about 3-mm diameter zirconia balls as media caused unsmoothed regions to be unevenly distributed on surfaces of the electrodes and caused the constraining layers to be insufficiently removed.

This is likely because although the about 3-mm diameter zirconia balls have a large mass and therefore can generate sufficient energy, the media have an extremely large curvature and therefore the distance between contacts is extremely large. Thus, the electrode surfaces cannot be efficiently smoothed and the constraining layers cannot be sufficiently removed.

The about 3-mm diameter zirconia balls, which have a large curvature, are capable of increasing the smoothness of the electrode surfaces after a large amount of time. However, the use of the about 3-mm diameter zirconia balls is not preferable because of the low productivity.

Therefore, under the conditions as described in Example 1, zirconia balls have a diameter in the range of about 1 mm to about 3 mm, for example, are preferably used.

The preferred range of the diameter of the media depends on the thickness of the constraining layers, a material included in the constraining layers, the density of a treatment liquid used, and other factors, and therefore is not necessarily limited to the range of about 1 mm to about 3 mm.

Example 2

The same base layer as the base layer of Example 1 was fired under substantially the same conditions as those described in Example 1, except that no constraining layer was used, whereby a ceramic substrate was obtained.

The ceramic substrate was subjected to smoothing under substantially the same conditions as those described in Example 1 using the same media as those (e.g., the about 2-mm diameter zirconia balls) used in Example 1.

As a result, the ceramic substrate included electrodes having a surface roughness Ra of about 0.15 μm, that is, excellent smoothness.

Example 3

Ceramic green sheets made of alumina were used to prepare a fired substrate. Copper electrode paste was preferably applied to the fired substrate by printing, for example. The fired substrate was fired (post-fired) at about 1000° C. in a reducing atmosphere, whereby a ceramic substrate including copper electrodes arranged thereon was prepared.

The copper electrodes had a surface roughness (Ra) of about 0.5 μm. The copper electrodes were subjected to smoothing under substantially the same conditions as those described in Example 1 using the same media as those (e.g., the 2-mm diameter zirconia balls) used in Example 1, whereby the surface roughness Ra thereof was improved to about 0.18 μm.

Example 4

The following sheets and paste were prepared: ceramic green sheets made of alumina used as a substrate material and tungsten paste used as an electrode (lead) material. The tungsten paste was preferably applied to the ceramic green sheets by screen printing, for example, whereby electrodes were formed. The resulting ceramic green sheets were stacked, pressed, and then fired, whereby an alumina substrate including the electrodes arranged thereon was obtained. The electrodes preferably had a surface roughness (Ra) of about 0.55 µm, for example. The electrodes were subjected to smoothing under substantially the same conditions as those described in Example 1 using substantially the same media as those (e.g., the 2-mm diameter zirconia balls) used in Example 1, whereby the surface roughness Ra thereof was improved to about 0.16 µm, for example.

Example 5

Figure 6:
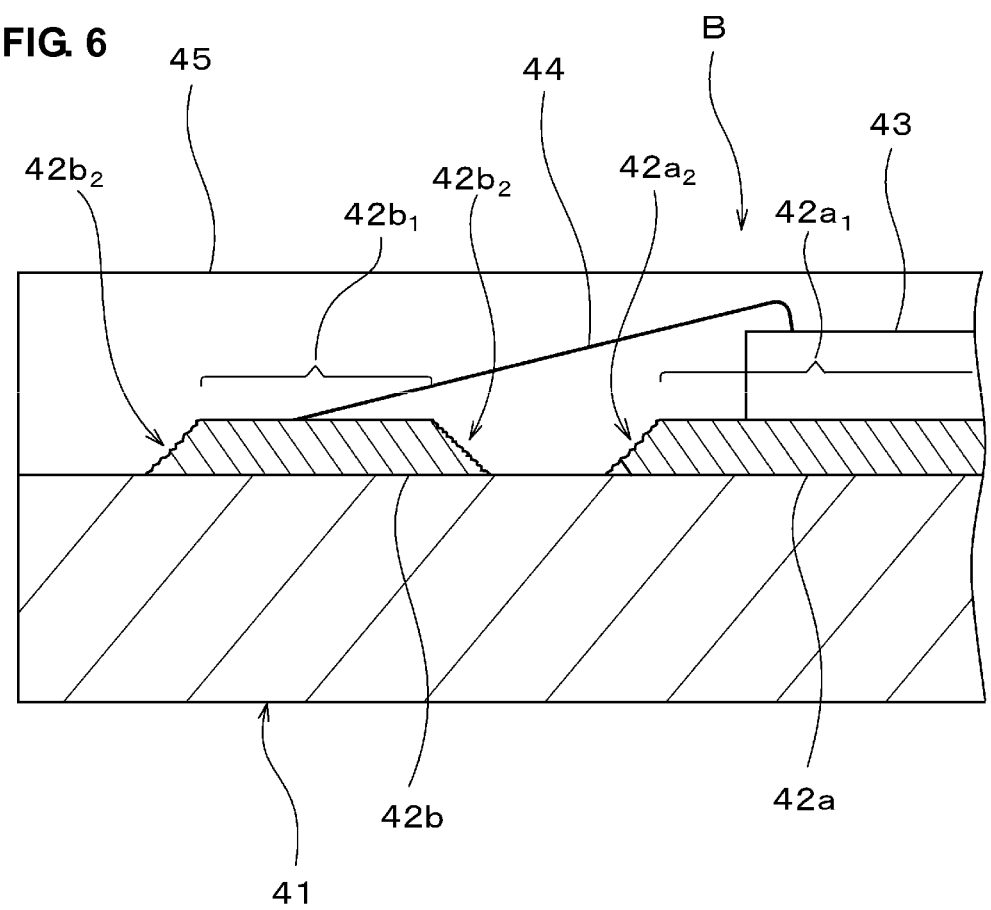
FIG. 6 is a schematic view of a ceramic substrate according to another preferred embodiment of the present invention.

FIG. 6 is a schematic view of a ceramic substrate according to another example of a preferred embodiment of the present invention. The ceramic substrate B was manufactured by substantially the same method as the ceramic substrate-manufacturing method described in Example 1 with reference to FIG. 5. The ceramic substrate B includes an IC chip 43 mounted on a surface electrode 42a disposed on a ceramic substrate body 41 and the IC chip 43 was electrically connected to a surface electrode 42b with a bonding wire 44. The upper surface of the ceramic substrate body 41 was preferably sealed with a sealing resin 45.

In the ceramic substrate of Example 5, the surface electrode 42a has a smooth central portion $42a_1$ underlying the IC chip 43 mounted thereon and the surface electrode 42b has a smooth central portion $42b_1$ subjected to wire bonding. The surface electrode 42a and the surface electrode 42b have an end portion $42a_2$ and an end portion $42b_2$, respectively, each having a rough surface, the end portions $42a_2$ and $42b_2$ not being subjected to IC chip mounting or wire bonding. In Example 5, in order to increase the bonding strength between the ceramic substrate body 41 and the sealing resin 45, the end portions $42a_2$ and $42b_2$ of the surface electrodes 42a and 42b have an increased surface roughness so as to have increased contact areas with the sealing resin 45 so as to provide an anchoring effect.

The following substrates were prepared: a ceramic substrate including surface electrodes 42a and 42b having smooth surfaces and a ceramic substrate having central portions $42a_1$ and $42b_1$ and end portion $42a_2$ and $42b_2$ with a surface roughness greater than that of the central portions $42a_1$ and $42b_1$. Sealing resins 45 provided in the ceramic substrates were measured for die shear strength. The sealing resin 45 of the ceramic substrate including the smooth surface electrodes had a die shear strength of about 80 N. The sealing resin 45 of the ceramic substrate including the end portions $42a_2$ and $42b_2$ with a high surface roughness had a die shear strength of about 100 N. This confirmed that the bonding strength between the sealing resin 45 and a ceramic substrate body 41 can be improved by adjusting the surface roughness of the end portions $42a_2$ and $42b_2$ to be greater than that of the central portions $42a_1$ and $42b_1$.

In this example, the surface roughness of the end portions of the surface electrodes was preferably adjusted to be greater than that of the central portions thereof such that the end portions to be surface-roughened were masked so as to be prevented from being smoothed by the bombardment of media.

Examples of a method for adjusting the surface roughness of the end portions of the surface electrodes to be greater than that of the central portions thereof include a method for roughening the end portions of the surface electrodes that are subjected to smoothing by a wet blasting process, for example, a method for adjusting the relationship between the size of the medium and the thickness of the electrodes, and a method for adjusting the direction of the media applied to the electrodes.

In each of the examples of preferred embodiments of the present invention described above, the base was defined by a ceramic substrate and electrodes disposed on the ceramic substrate were smoothed. The base, which includes the electrodes thereon that are to be smoothed, is not particularly limited. Preferred embodiments of the present invention are preferably widely applicable to the smoothing of electrodes disposed on or above bases, such as blocks other than tabular members and bases having curved surfaces underlying the electrodes, having various shapes or structures.

The present invention is not limited to the examples of preferred embodiments of the present invention described above. The type and/or mixing ratio of materials included in the bases, the structure of electrodes to be smoothed, materials included in the electrodes, conditions for the application of ultrasonic waves, and/or materials included in the media, may be modified or varied within the scope of the present invention.

According to preferred embodiments of the present invention, a surface of an electrode disposed on a base, such as ceramic substrate, can be efficiently and securely smoothed without damaging the electrode or the base. In particular, a surface of an electrode which is fired by a non-shrinkage process using a constraining layer and then separated from the constraining layer can be efficiently and securely smoothed.

Accordingly, preferred embodiments of the present invention are widely applicable to the manufacture of various electronic components, such as ceramic substrates, including surface electrodes.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for smoothing a surface of an electrode, comprising:
   preparing a base having the electrode disposed thereon; and
   smoothing a surface of the electrode by vibrating media such that the media are arranged to be in contact with the surface of the electrode.

2. The electrode-smoothing method according to claim 1, wherein during the step of smoothing, the base is immersed in a treatment liquid and an ultrasonic wave is applied to the treatment liquid.

3. The electrode-smoothing method according to claim 2, wherein the ultrasonic wave is applied to the treatment liquid while the base is disposed above a tray on which the media is disposed, such that the electrode is in contact with the media.

4. The electrode-smoothing method according to claim 2, wherein the ultrasonic wave is applied to the treatment liquid while the base is disposed on or above a tray such that a surface of the base on which the electrode is disposed faces upward and such that the media are arranged above the base such that the electrode is in contact with the media.

5. The electrode-smoothing method according to claim 2, wherein the treatment liquid is deaerated water.

6. The electrode-smoothing method according to claim 2, wherein the media have a density greater than that of the treatment liquid.

7. The electrode-smoothing method according to claim 1, wherein the media have a hardness greater than that of the electrode.

8. The electrode-smoothing method according to claim 1, wherein the media have a spherical shape.

9. The electrode-smoothing method according to claim 1, wherein the media are made of zirconia.

10. The electrode-smoothing method according to claim 1, wherein the electrode has an end portion and a central portion having a surface roughness different from that of the end portion.

11. A method for manufacturing a ceramic substrate, comprising a step of smoothing a surface of an electrode by the method according to claim 1, wherein the base is the ceramic substrate and the electrode is made of a sintered metal.

12. The ceramic substrate-manufacturing method according to claim 11, further comprising a step of forming at least one plating layer on the smoothed electrode.

13. A ceramic substrate manufactured by the ceramic substrate-manufacturing method according to claim 11, comprising an electrode with a smoothed surface.

* * * * *